United States Patent
Nakabayashi et al.

(10) Patent No.: US 11,078,596 B2
(45) Date of Patent: Aug. 3, 2021

(54) METHOD FOR EVALUATING QUALITY OF SIC SINGLE CRYSTAL BODY AND METHOD FOR PRODUCING SILICON CARBIDE SINGLE CRYSTAL INGOT USING THE SAME

(71) Applicant: SHOWA DENKO K.K., Tokyo (JP)

(72) Inventors: Masashi Nakabayashi, Tokyo (JP); Shoji Ushio, Tokyo (JP)

(73) Assignee: SHOWA DENKO K.K., Tokyo (JP)

( * ) Notice: Subject to any disclaimer, the term of this patent is extended or adjusted under 35 U.S.C. 154(b) by 15 days.

(21) Appl. No.: 16/306,129

(22) PCT Filed: Mar. 29, 2018

(86) PCT No.: PCT/JP2018/013390
§ 371 (c)(1),
(2) Date: Nov. 30, 2018

(87) PCT Pub. No.: WO2018/181788
PCT Pub. Date: Oct. 4, 2018

(65) Prior Publication Data
US 2020/0010974 A1    Jan. 9, 2020

(30) Foreign Application Priority Data
Mar. 30, 2017    (JP) .............................. JP2017-069381

(51) Int. Cl.
C30B 23/00    (2006.01)
C30B 29/36    (2006.01)
G01N 23/207    (2018.01)

(52) U.S. Cl.
CPC ............ *C30B 23/002* (2013.01); *C30B 29/36* (2013.01); *G01N 23/2076* (2013.01)

(58) Field of Classification Search
CPC .............. G06K 9/6223; G06N 3/0454; G10H 2210/056; G10H 2250/311; G10L 15/02;
(Continued)

(56) References Cited

U.S. PATENT DOCUMENTS

| | | | | |
|---|---|---|---|---|
| 2008/0182092 A1* | 7/2008 | Bondokov | ............ | C30B 29/403 428/220 |
| 2014/0291518 A1* | 10/2014 | Soejima | ............... | G01N 23/223 250/310 |
| 2016/0178679 A1* | 6/2016 | Kang | ...................... | H01L 22/12 438/14 |

FOREIGN PATENT DOCUMENTS

JP    2011-219296 A    11/2011
JP    2014-002104 A    1/2014

OTHER PUBLICATIONS

Noboru Ohtani, et al., "Propagation behavior of threading dislocations during physical vapor transport growth of silicon carbide (SiC) single crystals", Journal of Crystal Growth, 2006, pp. 55-60, vol. 286.

(Continued)

*Primary Examiner* — Matthew J Song
(74) *Attorney, Agent, or Firm* — Sughrue Mion, PLLC

(57) ABSTRACT

A method for evaluating the quality of a SiC single crystal by a non-destructive and simple method; and a method for producing a SiC single crystal ingot with less dislocation and high quality with good reproducibility utilizing the same. The method for evaluating the quality of a SiC single crystal body is based on the graph of a second polynomial equation obtained by differentiating a first polynomial equation, the first polynomial equation approximating the relation between a peak shift value and a position of the measurement point and the peak shift value being obtained by an X-ray rocking curve measurement. The method for producing a SiC single crystal ingot manufactures a SiC (Continued)

(A-A CROSS SECTION)

single crystal ingot by a sublimation recrystallization method using, as a seed crystal, the SiC single crystal body evaluated by the evaluation method.

9 Claims, 21 Drawing Sheets

(58) Field of Classification Search
CPC ... G10L 19/008; G10L 19/20; G10L 21/0272; G10L 25/18; G01N 23/20; G01N 23/2076; C30B 23/002; C30B 29/36
See application file for complete search history.

(56) References Cited

OTHER PUBLICATIONS

J.W. Lee, et al., "Origin of basal plane bending in hexagonal silicon carbide single crystals", Journal of Crystal Growth, 2008, pp. 4126-4131, vol. 310.
Noboru Ohtani, et al., "Structural investigation of the seeding process for physical vapor transport growth of 4H-SiC single crystals", Journal of Crystal Growth, 2014, pp. 9-15, vol. 386.
International Search Report for PCT/JP2018/013390 dated Jun. 12, 2018 [PCT/ISA/210].

* cited by examiner

METHOD FOR EVALUATING QUALITY OF SIC SINGLE CRYSTAL BODY AND METHOD FOR PRODUCING SILICON CARBIDE SINGLE CRYSTAL INGOT USING THE SAME

CROSS REFERENCE TO RELATED APPLICATIONS

This application is a National Stage of International Application No. PCT/JP2018/013390 filed Mar. 29, 2018, claiming priority based on Japanese Patent Application No. 2017-069381 filed Mar. 30, 2017.

FIELD

The present invention relates to a method for evaluating the quality of a SiC single crystal body composed of a disc-shaped silicon carbide single crystal and a method for producing a silicon carbide single crystal ingot using the same. More particularly, the present invention relates to a non-destructive method for evaluating a SiC single crystal body which can evaluate the amount of dislocation or the like, and a method for producing a silicon carbide single crystal ingot using a seed crystal evaluated by utilizing the evaluation method.

BACKGROUND

Silicon carbide (SiC) is a wide bandgap semiconductor having a wide forbidden bandwidth and has characteristics that far exceed conventional silicon (Si) such as voltage endurance, heat resistance, etc. Therefore, SiC has been actively researched and developed as a next generation semiconductor material.

One of techniques for growing a silicon carbide single crystal (SiC single crystal) is a sublimation recrystallization method in which a raw material powder of SiC loaded in a crucible is heated to generate sublimation gas and a SiC single crystal is recrystallized on a seed crystal of SiC disposed opposed thereto in the crucible (also referred to as an improved Rayleigh method).

In other words, in this method, a seed crystal is attached to the crucible lid constituting the crucible, the raw material powder of SiC is placed in the container main body (crucible main body) of the crucible, and the raw material powder of SiC is temporarily placed in a high vacuum state, then brought in an inert atmosphere to establish temperature gradient in the growth direction so that the temperature on the raw powder side becomes high and the temperature on the seed crystal side becomes low to sublimate the raw material powder. Thus, a bulk SiC single crystal (SiC single crystal ingot) is grown on the seed crystal. In this case, it is possible not only to control the occurrence of polycrystals but also to stably grow SiC single crystal of the objective polytype by stabilizing the crystal growth end face at the tip of the ingot so as to have a convex shape. Therefore, temperature gradient is established also in the in-plane direction so that the difference between the temperature $t_P$ at an arbitrary point on the growth surface in the periphery of the growing crystal and the temperature $t_C$ at the center of the ingot where the distance from this point is equal to the distance from the seed crystal ($\Delta t = t_P - t_C$) is usually positive, thus a moderate convex isotherm is formed in the growth space in the crucible toward the growth direction.

A substantially cylindrical bulk of single crystal SiC (SiC single crystal ingot) is obtained, which is subsequently cut out to a predetermined thickness to produce a SiC single crystal substrate. Furthermore, an epitaxial SiC single crystal wafer is grown by applying a thermal CVD method or the like to the resulting SiC single crystal substrate to form an epitaxial SiC single crystal wafer, which may be used for manufacturing various SiC devices including a power device.

Crystal growth by such a sublimation recrystallization method requires a temperature exceeding 2,000° C. In addition, crystal growth is performed by providing a temperature gradient between the seed crystal and the raw material powder. Therefore, dislocation and the like are inevitably included in thus obtained SiC single crystal, and the internal stress also remains. It is known that such a dislocation also affects the characteristics of the device and the like. Furthermore, the internal stress causes problems such as cracking during processing of SiC single crystal and warping when formed into a substrate. Accordingly, a method for reducing the dislocation and the internal stress of a SiC single crystal by optimizing the growth conditions such as pressure and temperature in the sublimation recrystallization method has been studied intensively.

Meanwhile, research and development have also been proceeded for a method for evaluating crystal quality with respect to dislocation density. The most common method for evaluating density and distribution of dislocation is chemical etching. For example, when a SiC single crystal is immersed in molten potassium hydroxide (KOH) at about 530° C. for several minutes, the surface of SiC single crystal is eroded by alkali. In this case, since the part where a certain type of crystal defect exists erodes, due to its high chemical activity, more rapidly than the normal crystal part, so-called etch pits are formed. Depending on the shape, size, density and distribution of the etch pits, the type and density of crystal defects and the like can be evaluated (see NPL1).

In addition, as a crystal evaluation using the principle of X-ray diffraction, evaluation by full width at half maximum (FWHM) of a diffraction line and crystal evaluation by X-ray topography are known. These methods are not limited to SiC materials but are widely adopted. For example, a method is reported, in which dislocations included in a SiC single crystal substrate is identified and dislocation density is measured by reflection X-ray topography using a MoKα ray as an X-ray source and an asymmetric reflection surface as a diffraction surface from the resulting X-ray topographic image (see PTL1). In addition, a method for evaluating the deviation of the crystal orientation of a SiC single crystal substrate based on the angle formed with the X-ray incident direction when a diffraction peak is exhibited during the X-ray rocking curve measurement has also been reported (see, for example, PTL2, NPLs 2 and 3).

CITATION LIST

Patent Literature

[PTL1] Japanese Unexamined Patent Publication No. 2014-2104
[PTL2] Japanese Unexamined Patent Publication No. 2011-219296

Non Patent Literature

[NPL1] N. Ohtani, et al., Journal of Crystal Growth, vols. 286 (2006) pp. 55-60
[NPL2] J. W. Lee, et al., Journal of Crystal Growth, vols. 310 (2008) pp. 4126-4131

[NPL3] N. Ohtani, et al., Journal of Crystal Growth, vols. 386 (2014) pp. 9-15

SUMMARY

Technical Problem

As a method for evaluating the quality of a SiC single crystal, a chemical etching method using molten KOH is now generally used. However, since this is a destructive inspection process an etched SiC single crystal substrate may not be used for production of a device, for example. Moreover, since the formation of etch pits by this chemical etching is influenced by anisotropy (crystal orientation, off angle) and concentration of impurity such as nitrogen, it is difficult to evaluate SiC single crystals having different properties on the same scale.

On the other hand, using the principle of X-ray diffraction, it is possible to conduct non-destructive evaluation. Particularly, in PTL2, a deviation (peak shift) of the <0001> crystal orientation is measured at a plurality of measurement points on the diameter of the SiC single crystal substrate, plotted on the basis of the position in the diameter direction, and the average peak shift amount (sec/mm) is obtained from the inclination of the linear approximation equation of the resulting graph. Since it is inevitable that internal stress produced in the SiC single crystal due to the characteristics of the growth method as described above which results in crystal deformation, such a method may be a very effective means to evaluate the shape of the basal surface of the SiC single crystal (a convex or concave shape of the basal surface, a size of a deformation angle thereof, etc.). However, the shape of such a basal surface depends on the balance of dislocation and stress in the SiC single crystal, and is also affected by the crystal growth by the sublimation recrystallization method and its cooling process. Accordingly, it is impossible to directly obtain the information on the quality inherent in the crystal itself such as dislocation.

On the other hand, according to the method of PTL1, it is possible to obtain highly accurate information such as ability to classify and count dislocations for each type. Moreover, unlike the chemical etching method which evaluates after etch pits are formed, SiC single crystals having different properties can be evaluated on the same scale. In general, however, it takes a relatively long time (several hours to several tens of hours) for the measurement of the high resolution X-ray topography and it takes a long time for the image analysis, as well. Accordingly, it is practically difficult to evaluate the dislocation on the surface (main surface) of the SiC single crystal substrate as a whole. Therefore, for example, it is impossible to make a device after grasping all the locations where dislocations concentrate on the main surface of the SiC single crystal substrate and the like.

Therefore, the inventors of the present invention studied intensively on a method capable of evaluating the quality of a SiC single crystal, which is suitable for device fabrication or the like by a non-destructive and simple method. As a result, the information on the concentration of dislocations can be obtained by approximating the deviation (peak shift) of the crystal orientation in the diameter direction as described in the above-mentioned PTL2 using a polynomial equation, and further differentiating the polynomial equation. Thus, we have attained the present invention.

Accordingly, an object of the present invention is to provide a method for evaluating the quality of a SiC single crystal which can evaluate the quality of a SiC single crystal by a non-destructive and simple method.

Another object of the present invention is to provide A method for producing a SiC single crystal ingot which can obtain a high quality SiC single crystal ingot with less dislocation by using, as a seed crystal, the SiC single crystal evaluated by the above method.

Solution to Problem

In other words, the gist of the present invention is as follows.

(1) A method for evaluating the quality of a SiC single crystal body composed of a disc-shaped silicon carbide single crystal,
which includes
measuring an X-ray rocking curve on a main surface of the SiC single crystal body on a predetermined diffraction surface;
obtaining an angle $\Omega$ at a plurality of measurement point $P_n$ on the diameter of the main surface when a diffraction peak is exhibited, wherein the $\Omega$ is an angle formed between an X-ray incident direction and the main surface;
calculating the difference $(\Omega_n - \Omega_0)$ as a respective peak shift value, in which $\Omega_0$ is an angle at a certain reference measurement point $P_0$ and $\Omega_n$ is an angle at a measurement point $P_n$ other than
$P_0$ among these measurement points;
obtaining a relation between the location of $P_n$ (X) and the peak shift value (Y) at the measurement point $P_n$ on the diameter of the main surface as a first polynomial equation;
linearly differentiating the first polynomial equation to obtain a second polynomial equation, and evaluating the quality of the SiC single crystal body based on these polynomial equations.

(2) The method for evaluating the quality of a SiC single crystal body according (1), wherein, when the second polynomial equation is expressed as a graph in which the Y axis indicates the inclination of the first polynomial equation and the X axis indicates the position of the measurement point $P_n$ on the diameter of the main surface of the SiC single crystal body, the quality is evaluated by determining whether the graph of the second polynomial equation passes Y=0 or not.

(3) The method for evaluating the quality of a SiC single crystal body according to (2), wherein the quality is evaluated by determining whether a graph representing the second polynomial equation passes Y=0 twice or not.

(4) The method for evaluating the quality of a SiC single crystal body according to (2) or (3), wherein the quality is evaluated by determining whether a function of a peak shift value (Y) in the first polynomial equation has an extreme value.

(5) The method for evaluating the quality of a SiC single crystal body according to any one of (1) to (4), wherein, when the second polynomial equation is expressed as a graph in which the Y axis indicates the inclination of the first polynomial equation and the X axis indicates the position of the measurement point on the diameter of the main surface of the SiC single crystal body, the quality is evaluated by a difference between a maximum value and a minimum value of the inclination (Y).

(6) The method for evaluating the quality of a SiC single crystal body according to any one of (1) to (5), wherein the degree of the first polynomial equation is 4 or more.

(7) The method for evaluating the quality of a SiC single crystal body according to any one of (1) to (6), wherein the reference measurement point $P_0$ is a center point of the main surface of the SiC single crystal body.

(8) The method for evaluating the quality of a SiC single crystal body according to any one of (1) to (7), wherein the dislocation of the SiC single crystal body is a basal surface dislocation.

(9) A method for producing a silicon carbide single crystal ingot in which a silicon carbide single crystal is grown on a seed crystal by a sublimation recrystallization method, wherein an X-ray rocking curve measurement of a main surface of the SiC single crystal body composed of a disc-shaped silicon carbide single crystal is previously conducted on a predetermined diffraction surface;

an angle $\Omega$ is obtained at a plurality of measurement points $P_n$ on a diameter of the main surface, wherein the $\Omega$ is an angle formed between an X-ray incident direction and the main surface when a diffraction peak is exhibited;

the difference $(\Omega_n - \Omega_0)$ is calculated as a respective peak shift value, in which $\Omega_0$ is an angle at a certain reference measurement point $P_0$ and $\Omega_n$ is an angle at a measurement point $P_n$ other than $P_0$ among these measurement points;

a relationship between the location of the measurement point $P_n$ (X) on the diameter of the main surface and the peak shift value (Y) is obtained as a first polynomial equation;

the first polynomial equation is linearly differentiated to obtain a second polynomial equation, and when thus obtained second polynomial equation is expressed as a graph in which the Y axis indicates the inclination of the first polynomial equation and the X axis indicates the position of the measurement point $P_n$ on the diameter of the main surface of the SiC single crystal body, the SiC single crystal body whose graph does not pass Y=0 twice or more is used as a seed crystal.

Advantageous Effects of Invention

The present invention makes it possible to evaluate the quality of the SiC single crystal by a non-destructive and simple method. Therefore, for example, it is possible to use the evaluated SiC single crystal as a SiC single crystal substrate for device fabrication. It is possible to manufacture SiC devices with excellent characteristics with high yield by using a SiC single crystal substrate with less dislocations. Using the SiC single crystal substrate with known dislocation state makes it easy to fabricate devices separately, to secure the application area, or the like.

In the method for manufacturing SiC single crystal ingot according to the present invention, by using as a seed crystal a SiC single crystal which has been screened by the above method for evaluating the quality, it is possible to manufacture a high quality SiC single crystal ingot having less dislocation with excellent reproducibility. Accordingly, the present invention has very high industrial utility.

DESCRIPTION OF EMBODIMENTS

Hereinafter, the present invention will be described in detail.

In the present invention, an X-ray rocking curve measurement of a main surface of a SiC single crystal body composed of a disc-shaped silicon carbide single crystal is conducted on a predetermined diffraction surface, and the angle $\Omega$ formed between the incident direction of the X-ray at the diffraction peak with maximized intensity of the diffracted X-ray and the main surface of the SiC single crystal body is obtained. The measurement of the X-ray rocking curve can be conducted in a similar way to the general method including the positional relationship between the X-ray measurement system and the measurement sample. In the present invention, however, such an angle Ω is obtained at a plurality of measurement points $P_n$ (n is an integer of 0 or more) on the diameter on the main surface of the SiC single crystal body 1, an example of which being illustrated in FIG. 1. In this case, although the quality evaluation according to the present invention will become more reliable when the angles Ω of the measurement points $P_n$ on two or more diameters are obtained, even measurement made on one diameter may provide a sufficiently reliable evaluation.

Figure 2:
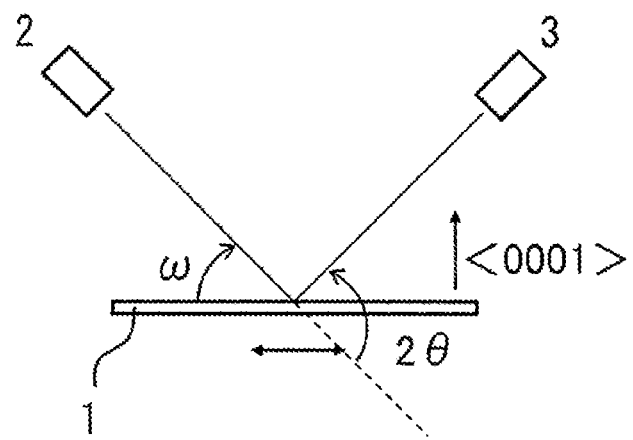
FIG. 2 is a schematic explanatory diagram illustrating a positional relationship between the X-ray measurement system and the SiC single crystal body in A-A cross section in FIG. 1.

In other words, as illustrated in FIG. 2, the 2θ axes of the X-ray irradiator 2 and the X-ray detector 3 are firstly fixed at a certain measurement point $P_n$ on the main surface of the SiC single crystal body 1 so as to meet the target diffraction conditions. As an X-ray source, a $K\alpha_1$ ray of Mo is generally used, but it is not particularly limited thereto. Although it is also possible to arbitrarily select the diffraction surface, usually reflection of the {0001} surface with strong reflection intensity is used. In this case, the actual reflection condition may also be selected depending on the purpose and crystallinity, for example, 0004 reflection and 00012 reflection so long as the SiC single crystal body is of 4H polytype. When the surface is of higher order, the area irradiated with the X-ray becomes smaller, and the measurement accuracy of the angle Ω formed at the diffraction peak will be improved. ω is an angle formed between the main surface of the SiC single crystal body 1 and the X-ray irradiation axis. The X-ray diffraction data is measured while changing the angle ω to find the inclination (that is, a formed angle Ω) at which the intensity of the diffracted X-ray becomes maximum.

The measurement point $P_n$ may be changed, for example, by moving the SiC single crystal body 1 in the direction indicated by the arrow in FIG. 2 to obtain the angle Ω formed at the plurality of measurement points $P_n$ on the diameter of the SiC single crystal body 1. A reference measurement point $P_0$ is a certain measurement point among the measurement points $P_n$. The reference measurement point $P_0$ is preferably a center point O on the main surface of the SiC single crystal body 1. The difference $(\Omega_n - \Omega_0)$, in which $\Omega_0$ is an angle at the reference measurement point $P_0$ and $\Omega_n$ is an angle at the measurement point $P_n$ other than $P_0$, is obtained, which is considered as a peak shift value.

Figure 3:
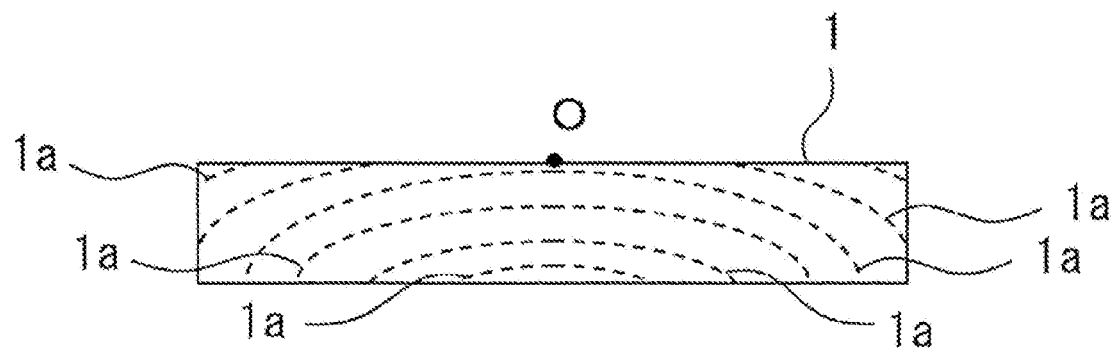
FIG. 3 is an explanatory view schematically illustrating the state (ideal state) of the basal surface of the SiC single crystal body.
Figure 4:
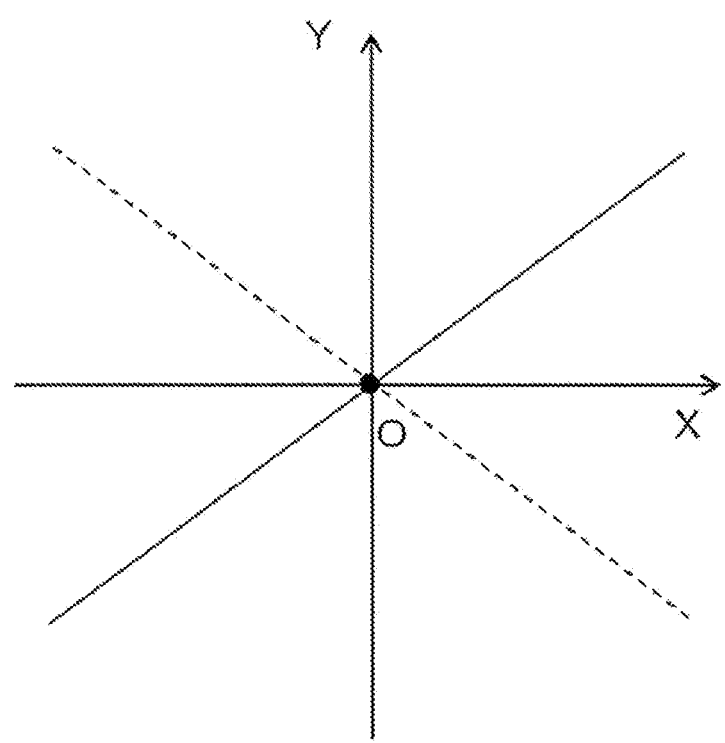
FIG. 4 is a graph schematically illustrating the relationship between the position (X) of the measurement point $P_n$ on the diameter of the SiC single crystal body and the peak shift value (Y) illustrated in FIG. 3.

Assuming that the all of the basal surfaces in the SiC single crystal body 1 are flat, the peak shift value is 0 (zero) across the entire main surface. In the sublimation recrystallization method, however, a temperature gradient is provided in the in-plane direction as well as in the growth direction, as described above. Accordingly, the basal surface 1a of the SiC single crystal body in general 1 is warped concentrically (convex) as schematically as illustrated in FIG. 3. In this case, the peak shift values will be positive in the semicircular region on one side and negative value in the semicircular region on the opposite side across the center point O of the SiC single crystal body 1. Therefore, the relationship between the position (X) of the measurement point $P_n$ on the diameter of the SiC single crystal body 1 and the peak shift value (Y) is expressed as a linear graph (line with a positive inclination) as illustrated in FIG. 4. In addition, the basal surface 1a of the SiC single crystal body 1 may sometimes show a concentrically recessed state contrary to the one illustrated in FIG. 3. In this case, the linear graph illustrated in FIG. 4 is represented as a straight line with a negative inclination. FIG. 3 and FIG. 4 schematically show an ideal crystal state ignoring the existence of dislocations and the like.

Figure 6:
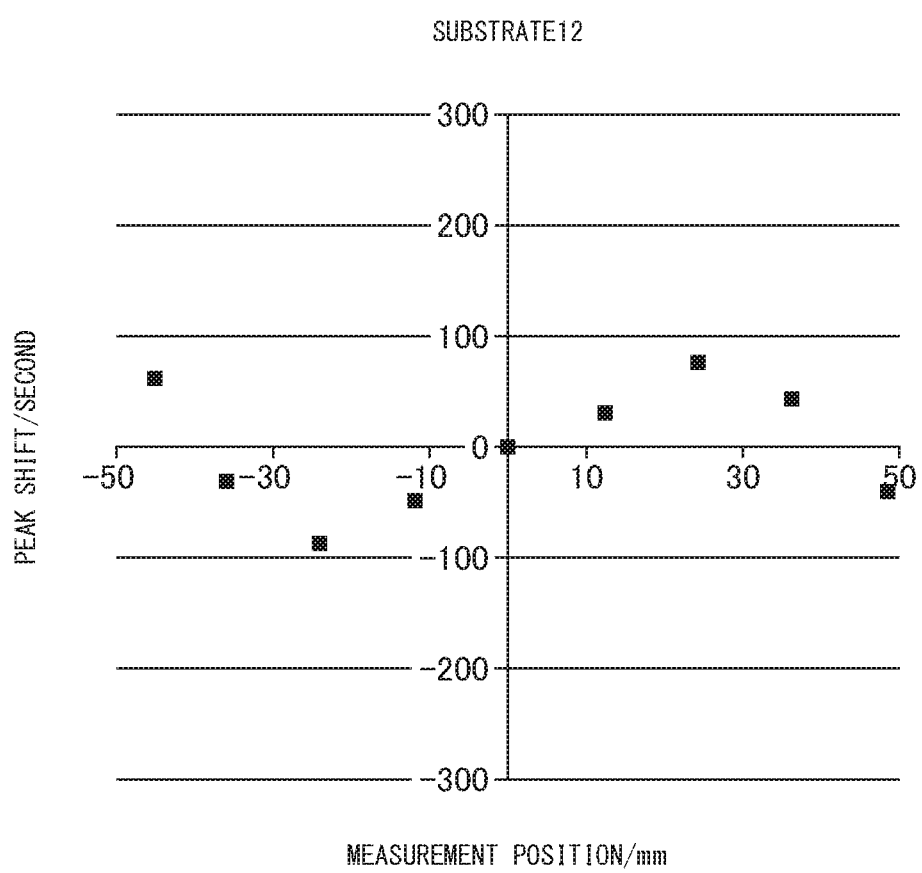
FIG. 6 is a graph illustrating the result of peak shift measurement of Substrate 12 in Exampled.

However, upon actual examination, the SiC single crystal bodies include, for example, those in which it is difficult to express the relationship between the position (X) of the measurement point $P_n$ on the diameter and the peak shift value (Y) as a linear graph, for example, in the case of FIG. 6 which will be described later in Example 1. Particularly, the tendency becomes remarkable in the case of a SiC single crystal body which is formed into a SiC single crystal substrate with a large diameter, such as 100 mm or more. In other words, the graphs is considered to include information on the quality of the SiC single crystal: for example, a graph of the peak shift value (Y) involving undulation and having a local maximum value or a minimum value (that is, an extreme value) of the function indicates that the basal surfaces may not be regularly arranged, and the point which exhibits change in the inclination of the peak shift value (Y) or exhibits an inflection point indicates that dislocations may concentrate in that point.

Therefore, in the present invention, the relationship between the position (X) of the measurement point $P_n$ on the diameter of the main surface of the SiC single crystal body and the peak shift value (Y) is determined as a first polynomial equation which is linearly differentiated to obtain a second polynomial equation, unlike in the prior art where the relationship is determined as a linear graph. Here, in obtaining the first polynomial equation, it is preferable to approximate it by a polynomial equation of fourth degree or higher. As the degree of the polynomial equation increases, the accuracy of approximation increases. However, when the order is increased more than necessary, the calculation becomes complicated and it is more likely to be affected by measurement error, local deterioration or the like, resulting in data fluctuation. Accordingly, it is preferably to use a polynomial equation of 9th degree or less.

In addition, when approximating the first polynomial equation, the polynomial equation may be determined while using a determination coefficient as a guide. As this determination coefficient, for example, determination coefficient $R^2$ of Excel (Microsoft Excel 2007) manufactured by Microsoft Japan Co., Ltd. which is a general-purpose spreadsheet software can be used, and preferably the approximation is determined so that the determination coefficient $R^2$ is 0.96 or more (In the following Examples, this determination coefficient $R^2$ of Excel was used). For example, when the determination coefficient $R^2$ is less than 0.96, the degree of the polynomial equation shall be optimized, or when there is protruding data, the data shall be re-examined, for example, by performing measurement again at more measurement points before and behind the point.

The second polynomial equation obtained by linearly differentiating the first polynomial equation can be expressed as a graph in which the Y axis indicates the inclination of the first polynomial equation and the X axis indicates the position of the measurement point $P_n$ on the diameter of the main surface of the SiC single crystal body. When the graph of the second polynomial equation passes Y=0 (when it intersects Y=0), it has a point where the inclination of the peak shift value in the first polynomial equation equals zero, that is, it has an inflection point, which means that crystalline anomalies is supposed to occur. In particular, based on the nature of the sublimation recrystallization method, it is presumed that the environment of crystal growth is aligned (or changed) concentrically. Therefore, typically the inflection points on the peak shift curve composed of the first polynomial equation forms concentric circles, and it is considered that the dislocations exist densely when the graph of the second polynomial passes Y=0 twice (intersects Y=0 twice).

For graphs based on the second polynomial equation, it is also possible to relatively predict the amount of dislocation generated from the difference between the maximum value and the minimum value of the inclination (Y). In other words, the difference between the maximum value and the minimum value of the inclination (Y) represents the magnitude of the undulation of the graph of the peak shift value (Y) in the first polynomial equation, and the one having a larger difference is considered to have relatively larger amount of dislocation than the one having a smaller difference.

As described above, in the present invention, the state (deformation of the crystal) of the basal surface of the SiC single crystal body is directly observed by examining the state of the inflection point of the peak shift curve composed of the first polynomial equation. Such deformation of the crystal is due to complex factors, but it is typically considered to be affected by the basal surface dislocation density. Therefore, it is possible to evaluate the amount of basal surface dislocation included in the SiC single crystal body, for example, by the following procedure.

First, whether or not the graph of the second polynomial equation passes Y=0 (that is, presence or absence of inflection point of the peak shift curve consisting of the first polynomial equation) is confirmed (hereinafter referred to as primary evaluation). It is considered that those passing Y=0 includes a large amount of basal surface dislocation, and those without passing Y=0 includes a small amount of basal surface dislocation. For those passing Y=0, the amount of dislocation can be further evaluated according to the number of passages. Those passing twice or more are considered to include dense dislocations in particular. Furthermore, as for those passing only once, the inclination may appear as zero due to the existence of the local maximum value when approximating the first polynomial equation. Therefore, as to a graph of the second polynomial equation passing through Y=0, it is further recommended to examine whether or not it is caused by concentration of dislocation by determining whether or not the data of the peak shift value of the first polynomial equation is associated with undulation which leads to an extreme value in the function.

Next, for the primary evaluation, the difference between the maximum value and the minimum value of the inclination (Y) of the graph of the second polynomial equation [that is, the change in the inclination of the peak shift curve composed of the first polynomial equation (the amount of change in the value of the second polynomial equation)] is obtained, and the amount of dislocation included in the SiC single crystal body is evaluated as a whole based on the degree of the difference (hereinafter referred to as secondary evaluation). In other words, it can be classified into those including considerably large amounts of dislocations and those not including such large amounts of dislocation by primary evaluation, and the secondary evaluation can further evaluate the amount of dislocation.

Evaluation based on such primary evaluation and secondary evaluation may be performed on a single SiC single crystal body or may be relatively evaluated for a plurality of SiC single crystal bodies. In addition, in these evaluations, since it is possible to acquire information on dislocation included in the SiC single crystal body in a non-destructive manner, for example, the evaluated SiC single crystal body can be used as a SiC single crystal substrate for device fabrication.

On the other hand, when a SiC single crystal body evaluated according to the present invention is used as a seed crystal in a sublimation recrystallization method, a high-quality SiC single crystal ingot with less dislocation can be manufactured with good reproducibility. In general, it is advantageous to use a SiC single crystal with less dislocation such as basal surface dislocation as a seed crystal in order to obtain a good-quality SiC single crystal ingot with less dislocation. However, the quality of the seed crystal is not always taken over by the resulting SiC single crystal ingot as it is. That is why the improvement of the quality of the SiC single crystal ingot is difficult. In other words, the quality of SiC single crystal ingot obtained cannot be predicted based only on the dislocation density of the seed crystal. The SiC single crystal body evaluated according to the present invention, in particular, those in which the graph of the second polynomial equation does not pass Y=0 twice or more is used to suppress the dislocation density of the obtained SiC single crystal ingot. This is because, as described above, in the method for evaluating of the present invention, by observing the state of the basal surface of the SiC single crystal body (deformation of crystal), it is possible to select those with small undulation of crystals. Eventually, it becomes possible to manufacture a high-quality SiC single crystal ingot with good reproducibility.

In the present invention, the SiC single crystal body to be evaluated may be made of a disk-shaped SiC single crystal such as a SiC single crystal substrate or the like. However, as the thickness becomes thinner, the rigidity may decrease and the peak shift value and an inclination may be changed. There is a fear that when the SiC single crystal body is made too thin, the peak shift may be influenced by processing strain. Therefore, in order to enable more accurate and reproducible measurement while avoiding such influences, the thickness of the SiC single crystal body is preferably 0.5 mm or more, preferably 1.0 mm or more. The crystal has sufficient rigidity as it becomes thicker, and it becomes less likely to be influenced by the surface state or change in thickness. Accordingly, it is advantageous when the thickness of the SiC single crystal body to be evaluated is increased. However, it is not necessary to make it thicker than necessary as long as it retains rigidity not to affect the measurement. Taken into above considerations, it can be said that the upper limit of the thickness of the SiC single crystal body is substantially 3 mm.

Since the peak shift is evaluated as a relative value with respect to the reference measurement point, it can be evaluated regardless of the off angle of the SiC single crystal substrate, for example. In other words, even a SiC single crystal substrate cut out from grown ingots having different off angles can be compared with each other by using the method for evaluating of the present invention.

EXAMPLES

The present invention will be hereinafter described based on Examples, but the present invention is not limited to them.

Example 1

The SiC single crystal substrate cut out from SiC single crystal ingot manufactured by a sublimation recrystallization method using a seed crystal was evaluated as follows.

First, three SiC single crystal substrates cut out from different SiC single crystal ingots were prepared (Substrates 11, 12, and 13). All of them are substrates with a diameter of 100 mm, having (0001) surface as the main surface, and both sides of which have been finally mirror-finished by polishing by means of a diamond slurry having an average particle size of 0.5 μm. The thickness after polishing is about 1.12 mm.

Figure 1:
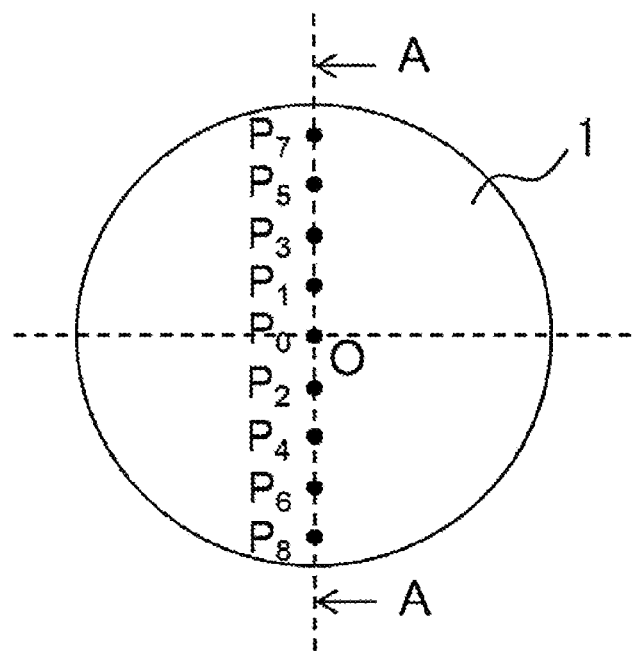
FIG. 1 is a schematic explanatory diagram illustrating an example of a measurement point $P_n$ for calculating a peak shift value on the main surface of a SiC single crystal body.
Figure 5:
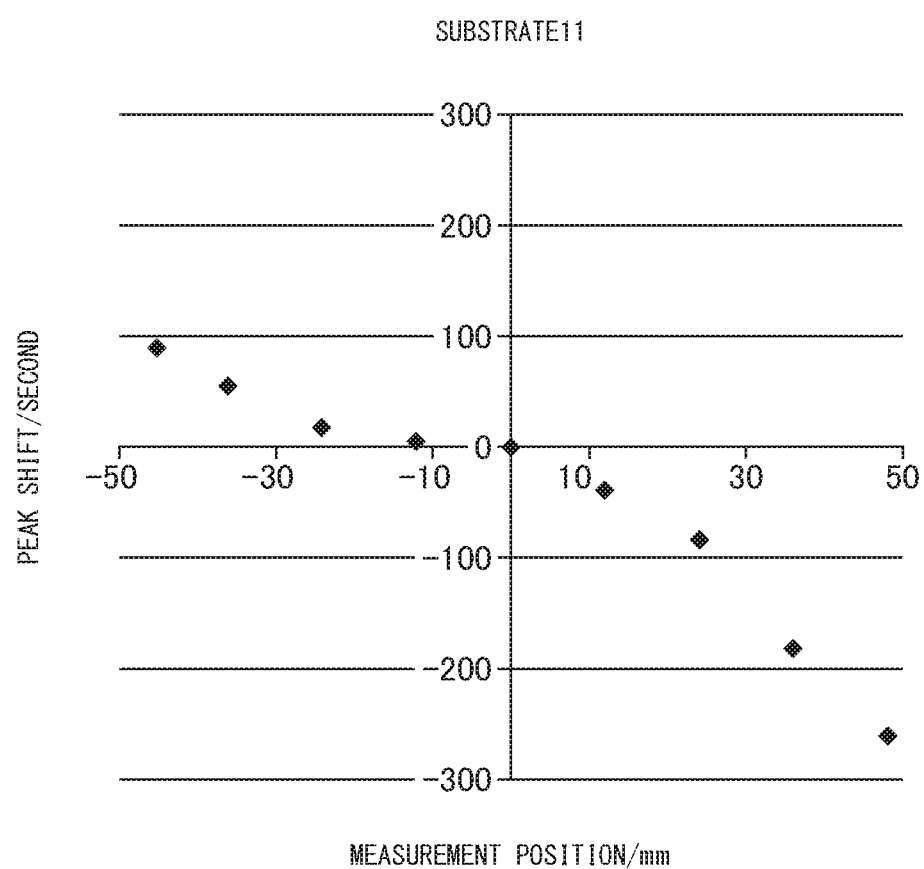
FIG. 5 is a graph illustrating the result of peak shift measurement of Substrate 11 in Examples.
Figure 7:
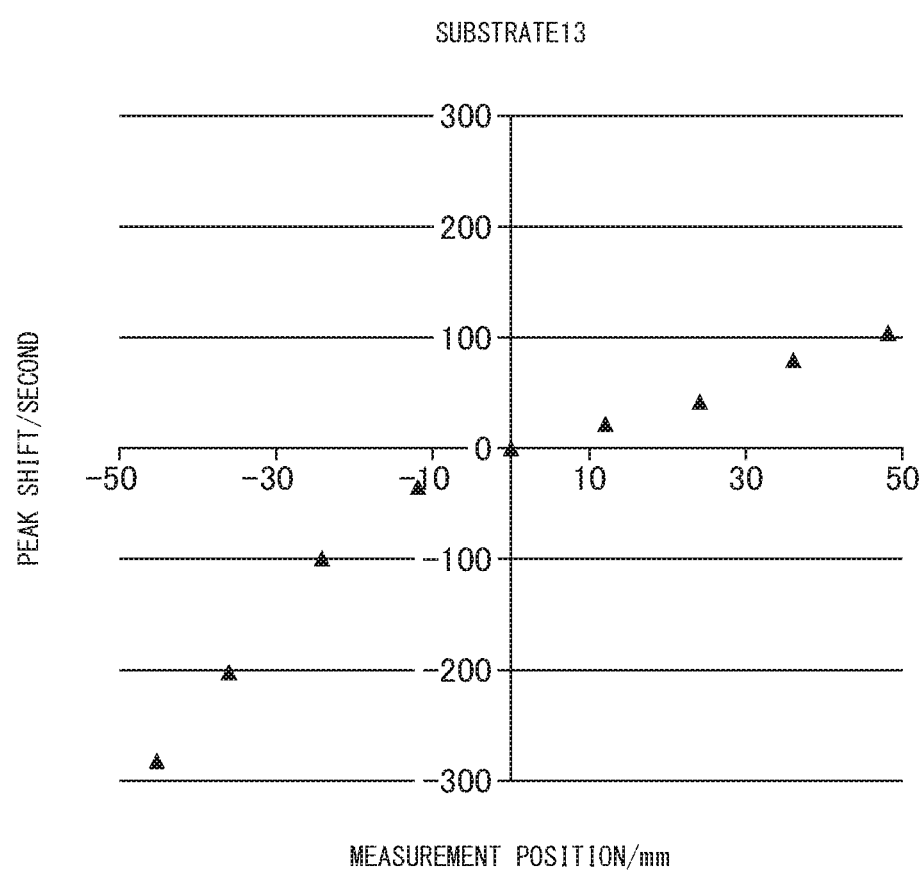
FIG. 7 is a graph illustrating the result of peak shift measurement of Substrate 13 in Examples.

With respect to these SiC single crystal substrates, as illustrated in FIG. 1, the center point O on the (0001) surface which is the main surface is taken as the reference measurement point $P_0$, and the X-ray rocking curve measurement was carried out at eight measurement points $P_0$ to $P_8$, which were arranged at an interval of 12 mm on the diameter, the reference measurement point $P_0$ being a center, and the angle $\Omega$ formed between the incident direction of the X-ray and the main surface when the diffraction peak was exhibited was calculated. Specifically, the X-ray source of the X-ray diffractometer (SmartLab manufactured by Rigaku Corporation) used for the measurement was $K\alpha_1$ ray of Mo, and under the condition of the X-ray irradiation spot size 1 mm×4 mm, the position (the formed angle $\Omega$) with maximized intensity of the diffracted X-ray by 0004 reflection was determined. Next, the difference $(\Omega_n-\Omega_0)$ between the angle $\Omega_0$ formed at the reference measurement point $P_0$ and the angle $\Omega_n$ formed at the other measurement points $P_n$ was calculated as the peak shift value. The results of peak shift measurement are illustrated in FIG. 5 (Substrate 11), FIG. 6 (Substrate 12), and FIG. 7 (Substrate 13).

Regarding the result of the peak shift measurement, approximation of the relationship between the position (X) of the measurement point $P_n$ of each substrate and the peak shift value (Y) by a fifth-order polynomial equation is expressed as follows (first polynomial equation). All of them had a determination coefficient $R^2$ of 0.98 or more.

<Substrate 11: Determination coefficient $R^2$=0.99>

$$Y=4.82197\times10^{-07}\times X^5+1.11390\times10^{-05}\times X^4-2.25898\times10^{-03}\times X^3-5.87409\times10^{-02}\times X^2-1.10509\times X-3.81586$$

<Substrate 12: Determination Coefficient $R^2$=0.98>

$$Y=-7.87186\times10^{08}\times X^5+9.91579\times10^{-06}\times X^4-2.41675\times10^{-03}X^3-5.27713\times10^{-03}\times X^2+4.41008\times X-5.24975$$

<Substrate 13: Determination Coefficient $R^2$=1.00>

$$Y=-1.28613\times10^{-06}\times X^5+1.20904\times10^{-04}\times X^4+1.29586\times10^{-03}\times X^3-4.05824\times10^{-01}\times X^2+1.36766\times10\times X-2.29461\times10$$

Figure 8:
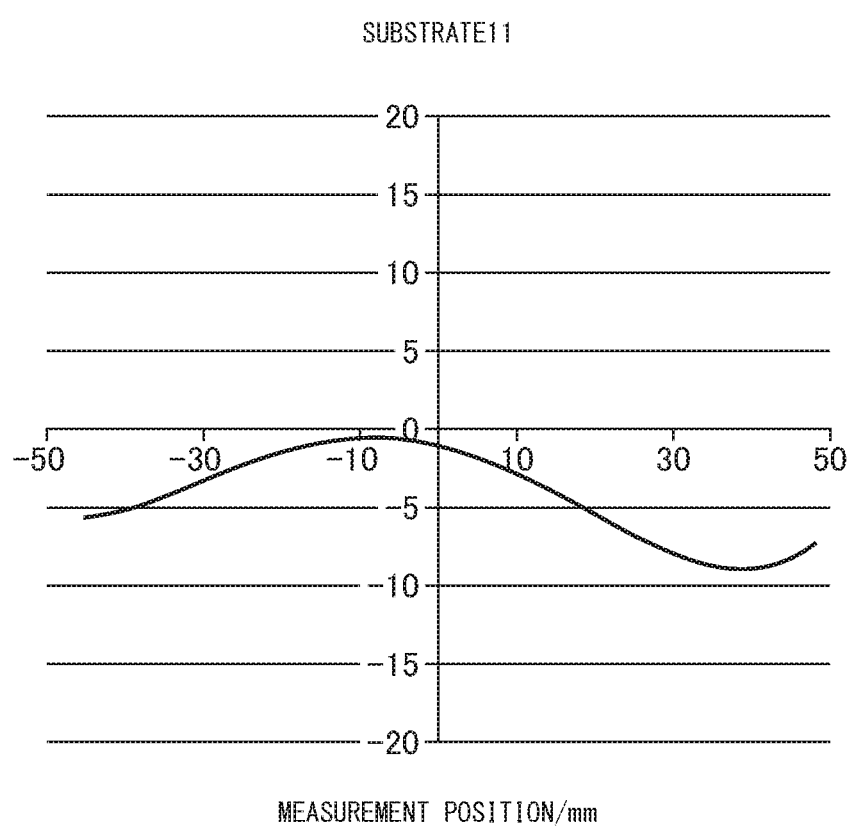
FIG. 8 is a graph illustrating a second polynomial equation obtained by differentiating the first polynomial of Substrate 11 illustrated in FIG. 5.
Figure 9:
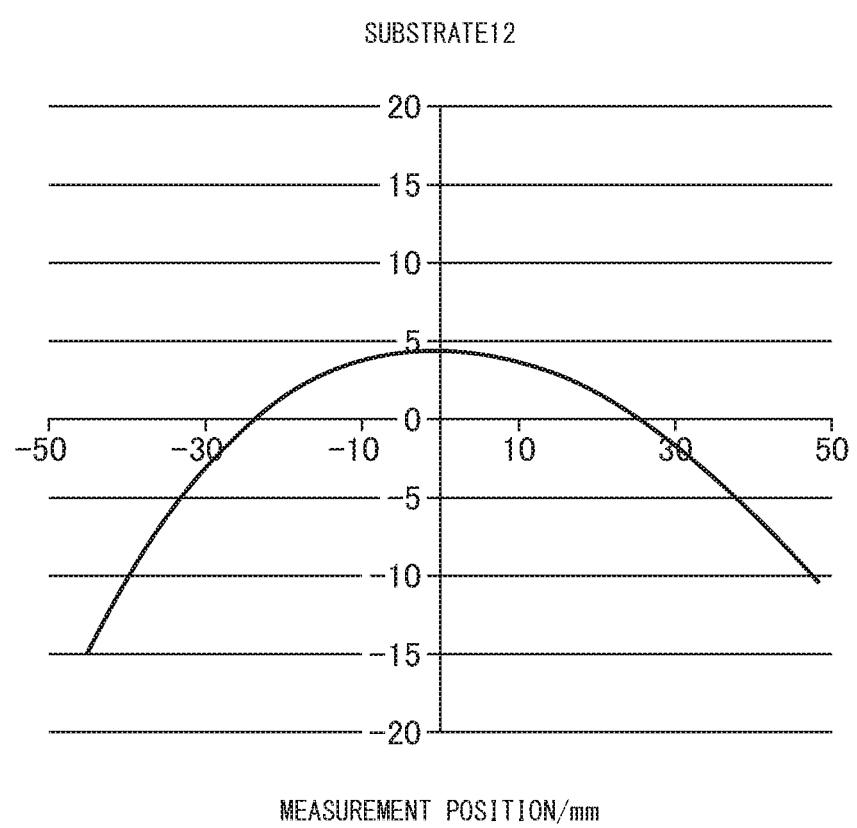
FIG. 9 is a graph illustrating a second polynomial equation obtained by differentiating the first polynomial of Substrate 12 illustrated in FIG. 6.
Figure 10:
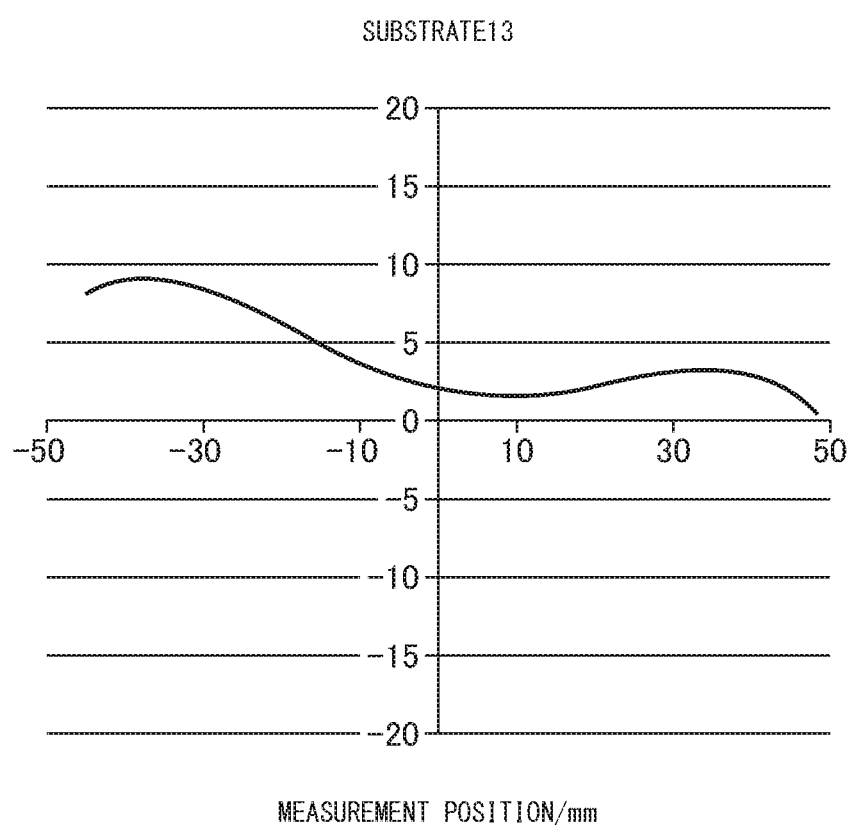
FIG. 10 is a graph illustrating a second polynomial equation obtained by differentiating the first polynomial of Substrate 13 illustrated in FIG. 7.

Subsequently, these first polynomial equations are differentiated into a fourth-order polynomial equation (a second polynomial equation), and the results of the graph are illustrated in FIG. 8 (Substrate 11), FIG. 9 (Substrate 12), FIG. 10 (Substrate 13). In these graphs, the Y axis indicates the inclination of the first polynomial equation and the X axis indicates the position of the measurement point $P_n$ on the main surface of the SiC single crystal substrate. With respect to the graphs illustrated in FIGS. 8 to 10, it was checked whether or not these graphs pass Y=0 (intersect with Y=0), and the difference between the maximum value and the minimum value of the inclination (Y) was obtained. The results are illustrated in Table 1.

TABLE 1

| | EVALUATION OF THE SECOND POLYNOMIAL EQUATION | | |
|---|---|---|---|
| | NUMBER OF PASSING ACROSS Y = 0 | MAXIMU-MINIMUM | EVALUATION RANK |
| SUBSTRATE 11 | 0 | 8.28 | 1 |
| SUBSTRATE 12 | 2 | 19.44 | 3 |
| SUBSTRATE 13 | 0 | 8.71 | 2 |

As illustrated in Table 1, in Substrate 12, the graph of the second polynomial equation (FIG. 9) passes through Y=0 twice, and the largest amount of basal surface dislocations is included compared with these substrates. The difference between the maximum value and the minimum value of the inclination (Y) of Substrate 13 is larger than that of Substrate 11 although the difference is small between Substrate 11 and Substrate 13, the graphs of which do not pass Y=0 even once. Thus, it is thought that dislocations included in Substrate 13 is larger than that included in Substrate 11. Therefore, when evaluated in ascending order of the number of basal surface dislocations, the order was Substrate 11, Substrate 13, and Substrate 12.

Figure 23:
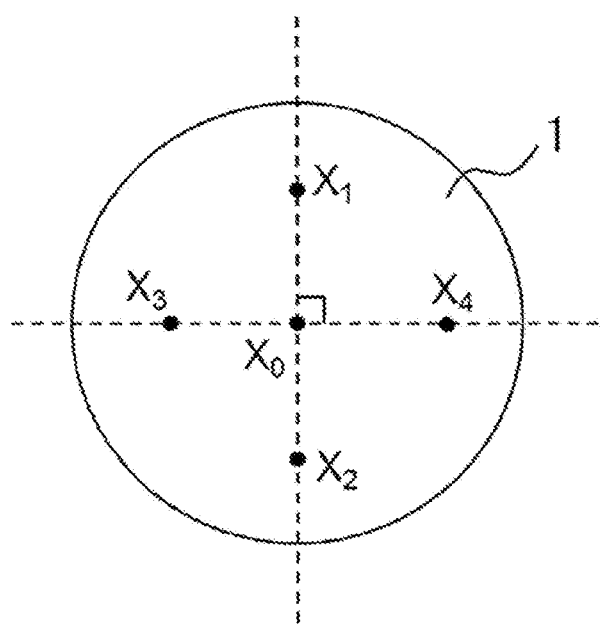
FIG. 23 is a schematic explanatory diagram illustrating a portion where etch pits of basal surface dislocation are counted after KOH etching of the substrate in Examples.

For the purpose of confirmation, the above three substrates (SiC single crystal substrates) were etched in a potassium hydroxide bath at 520° C. for 5 minutes, and the etch pits derived from the basal surface dislocation generated by the KOH etching were counted at 5 points illustrated in FIG. 23 to obtain the basal surface dislocation density. In other words, the number of the points where the etch pits were counted was five in total, including the center point $X_0$ of the substrate and points $X_1$ to $X_4$ each located at a distance of 30 mm from the center point $X_0$ on diameters orthogonal to each other. The etch pits originating from the basal surface dislocation were counted in a 250 μm×250 μm square area around the respective measurement point as a center thereof. The results are illustrated in Table 2.

TABLE 2

| | EVALUATION BY KOH ETCHING | |
|---|---|---|
| | BASAL SURFACE TRANSFRENCE DENSITY (transferences/cm$^2$) | EVALUATION RANK |
| SUBSTRATE 11 | 249 | 1 |
| SUBSTRATE 12 | 8720 | 3 |
| SUBSTRATE 13 | 263 | 2 |

As illustrated in Table 2, as a result of evaluating the basal surface dislocation density of the substrate by KOH etching, the basal surface dislocation density of Substrate 12 was very high, and Substrate 11 and Substrate 13 were at about the same level. In other words, the evaluation result by etching which is a destructive inspection is in good agreement with the result of method for evaluation according to the present invention. In the vicinity where the second graph of Substrate 12 passes Y=0, the number of basal surface dislocations is very large, which is considered to increase the overall average value of the basal surface dislocation density of Substrate 12.

Example 2

In the same manner as in Example 1, three SiC single crystal substrates cut out from different SiC single crystal ingots were prepared (Substrates 21, 22, and 23). However, all of them are substrates with a diameter of 150 mm, having (0001) surface as the main surface, and both sides of which have been finally mirror-finished by polishing by means of a diamond slurry having an average particle size of 0.5 μm. The thickness after polishing is about 1.43 mm.

With respect to these SiC single crystal substrates, in the same manner as in Example 1, except that the X-ray rocking curve measurement was carried out at thirteen measurement points $P_0$ to $P_{12}$, including the reference measurement point $P_0$ which is the center point O of the (0001) surface as a main surface and points which were arranged at an interval of 12 mm on the diameter, this reference measurement point $P_0$ being as a center, the angle Ω formed between the incident direction of the X-ray and the main surface when the diffraction peak was exhibited was calculated, and the peak shift value was calculated considering the center point O of the (0001) surface as the reference measurement point P0. The results of peak shift measurement are illustrated in FIG. 11 (Substrate 21), FIG. 12 (Substrate 22), and FIG. 13 (Substrate 23).

Figure 11:
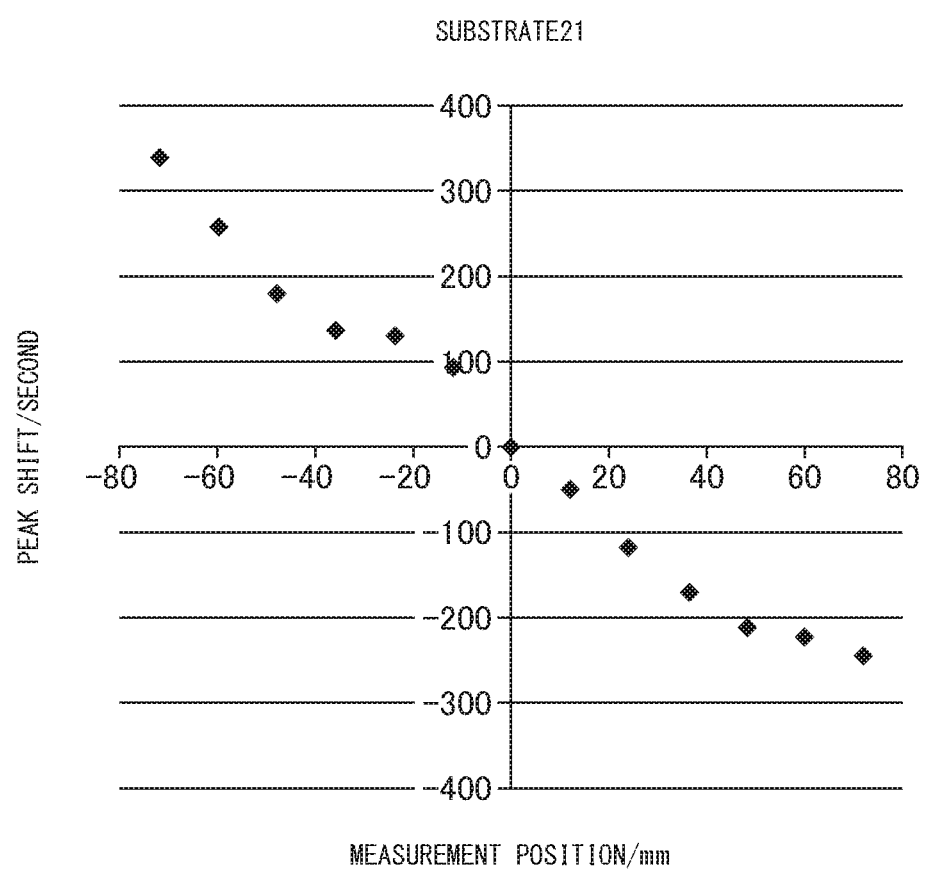
FIG. 11 is a graph illustrating the result of peak shift measurement of Substrate 21 in Examples.
Figure 12:
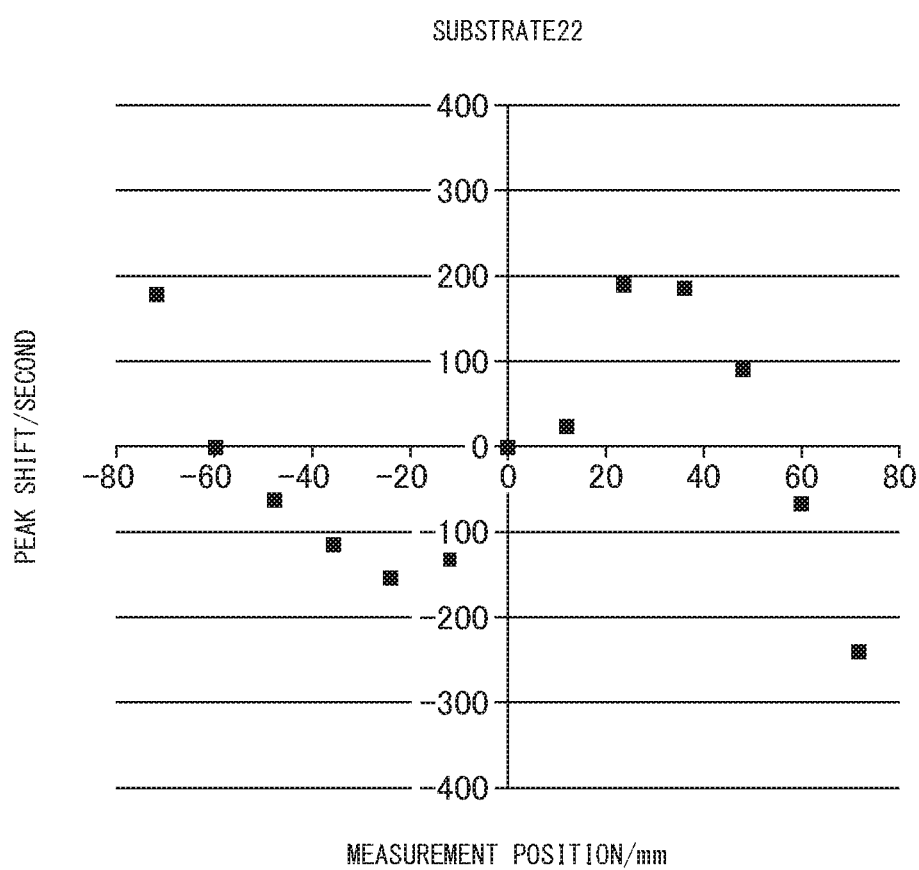
FIG. 12 is a graph illustrating the result of peak shift measurement of Substrate 22 in Examples.
Figure 13:
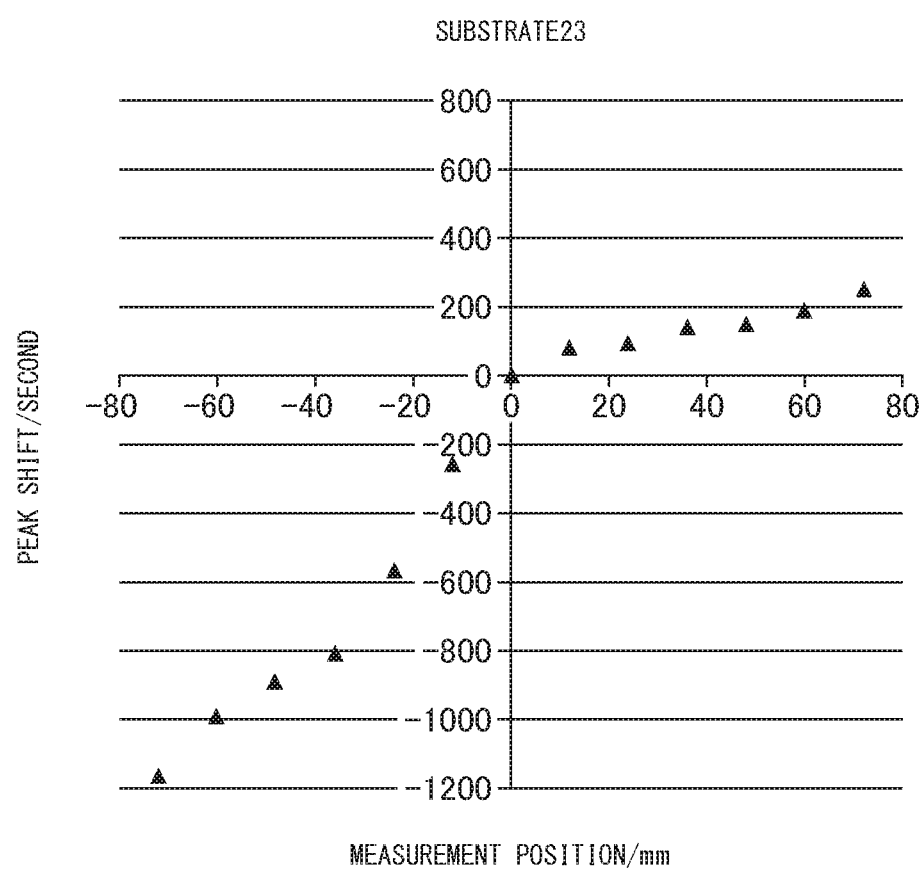
FIG. 13 is a graph illustrating the result of peak shift measurement of Substrate 23 in Examples.
Figure 14:
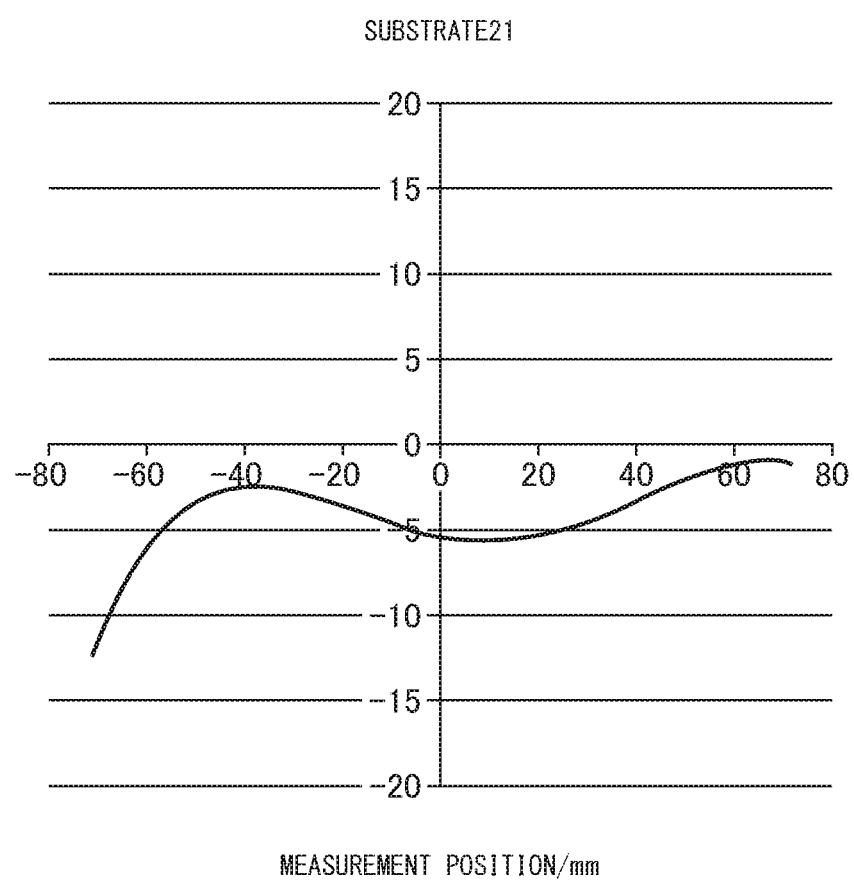
FIG. 14 is a graph illustrating a second polynomial equation obtained by differentiating the first polynomial of Substrate 21 illustrated in FIG. 11.

In addition, with respect to the results of the peak shift measurement illustrated in FIGS. 11, 12, and 13, the relationship between the position (X) of the measurement point $P_n$ of each substrate and the peak shift value (Y) was approximated by a fifth order polynomial equation to obtain a first polynomial equation which was further differentiated to obtain a second polynomial equation composed of the fourth order polynomial equation. The results are illustrated in FIG. 14 (Substrate 21), FIG. 15 (Substrate 22), and FIG. 16 (Substrate 23). The determination coefficient $R^2$ when approximating the first polynomial equation relating to Substrate 21 was 0.99, the determination coefficient $R^2$ when approximating the first polynomial equation on Substrate 22 was 0.96, and the coefficient $R^2$ when approximating the first polynomial equation on Substrate 23 was 0.99.

Figure 15:
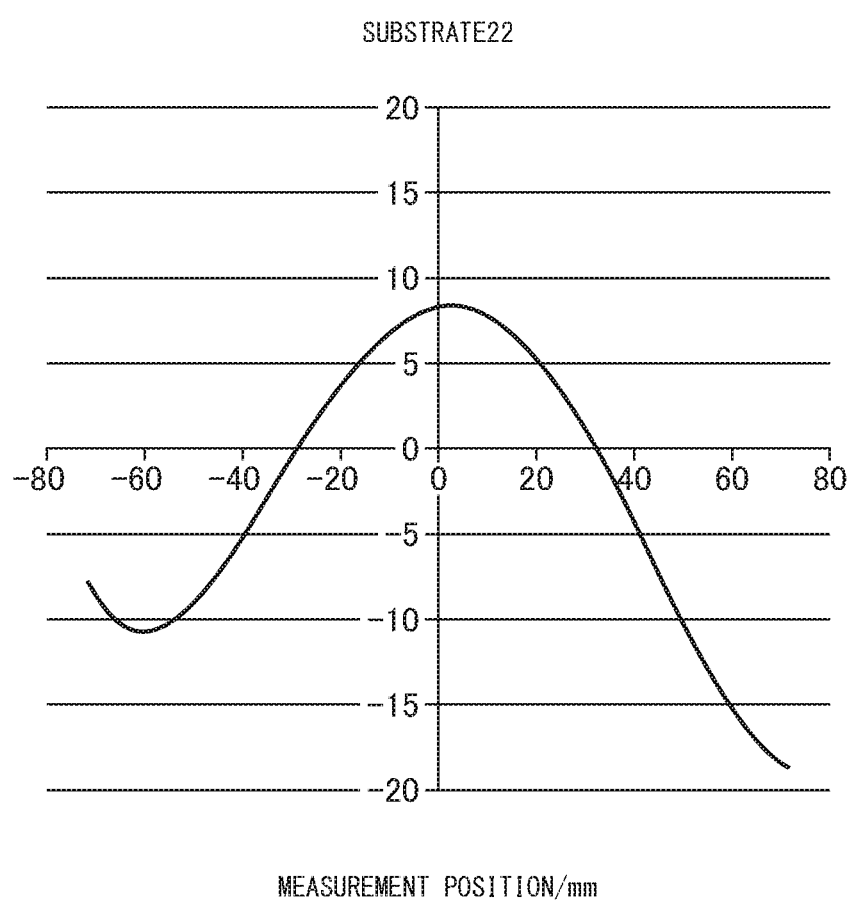
FIG. 15 is a graph illustrating a second polynomial equation obtained by differentiating the first polynomial equation of Substrate 22 illustrated in FIG. 12.
Figure 16:
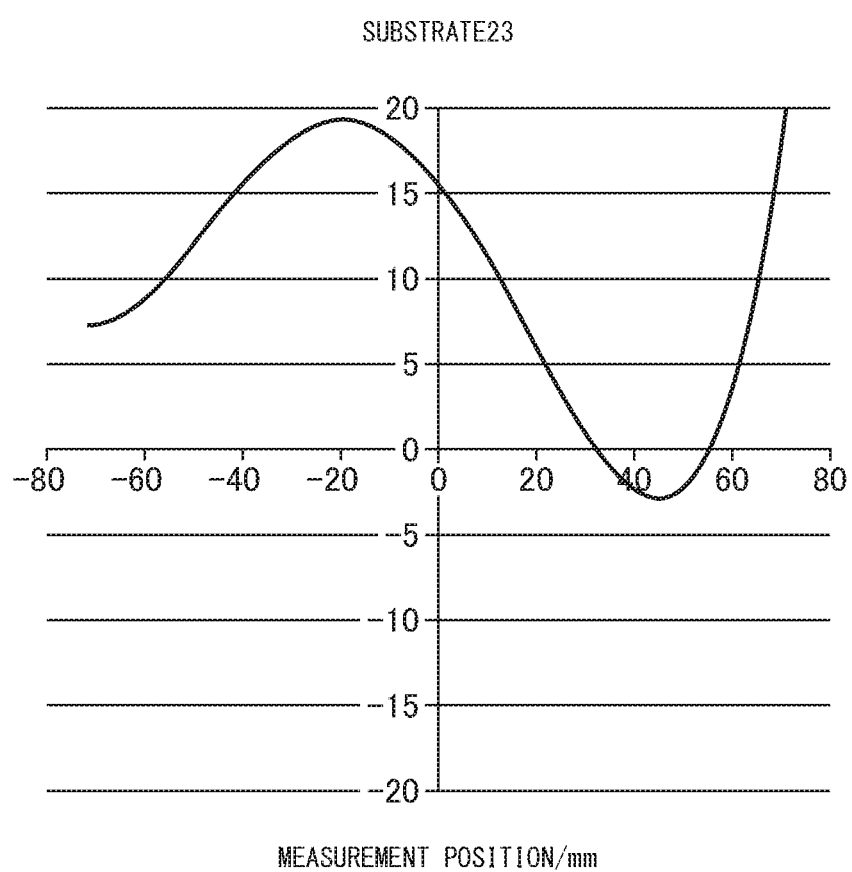
FIG. 16 is a graph illustrating a second polynomial equation obtained by differentiating the first polynomial equation of Substrate 23 illustrated in FIG. 13.

For the graphs of the second polynomial equation of FIG. 14 (Substrate 21), FIG. 15 (Substrate 22) and FIG. 16 (Substrate 23) obtained above, whether or not these graphs pass through Y=0 (intersect with Y=0) was determined and the difference between the maximum value and the minimum value of the inclination (Y) was obtained. The results are illustrated in Table 3.

TABLE 3

| | EVALUATION OF THE SECOND POLYNOMIAL EQUATION | | |
|---|---|---|---|
| | NUMBER OF PASSING ACROSS Y = 0 | MAXIMU-MINIMUM | EVALUATION RANK |
| SUBSTRATE 21 | 0 | 11.52 | 1 |
| SUBSTRATE 22 | 2 | 26.92 | 3 |
| SUBSTRATE 23 | 2 | 23.64 | 2 |

As illustrated in Table 3, in Substrate 22, the graph of the second polynomial equation (FIG. 15) passes through Y=0 twice, and is considered that the substrate includes the larger amount of basal surface dislocations compared to Substrate 21. On the other hand, the difference between the maximum value and the minimum value of the inclination (Y) for Substrate 21 whose graph never passes Y=0 is not more than ½ the difference of Substrate 22. Therefore, Substrate 21 is considered to be a high-quality SiC single crystal substrate with less dislocation than that of Substrate 22. Meanwhile, Substrate 23 has the difference between the maximum value and the minimum value which is larger than that of Substrate 21 and whose graph passes Y=0 twice. However, as is clear from the graph of FIG. 13, in fact, there is no undulation of the peak shift such as the function having an extreme value. Thus, such a large difference is due to the appearance of the local maximum value of the approximate function. It was determined that the quality of the crystal of Substrate 23 was superior to that of Substrate 22, considering the fact that there was no undulation in this peak shift.

Next, for the purpose of confirmation, the above three substrates (SiC single crystal substrates) were etched in a potassium hydroxide bath at 520° C. for 5 minutes, and the etch pits derived from the basal surface dislocation generated by the KOH etching were counted at 5 points illustrated in FIG. 23 to obtain the basal surface dislocation density. In other words, the number of the points where the etch pits were counted was five in total, including the center point $X_0$ of the substrate and points $X_1$ to $X_4$ each located at a distance of 30 mm from the center point $X_0$ on diameters orthogonal to each other. The etched pits originating from basal surface dislocation were counted in a 250 μm×250 μm square area around the respective measurement point as a center thereof. The results are illustrated in Table 4.

TABLE 4

| | EVALUATION BY KOH ETCHING | |
|---|---|---|
| | BASAL SURFACE TRANSFRENCE DENSITY (transferences/cm$^2$) | EVALUATION RANK |
| SUBSTRATE 21 | 1052 | 1 |
| SUBSTRATE 22 | 17050 | 3 |
| SUBSTRATE 23 | 5982 | 2 |

As is apparent from Table 4, Substrate 21 had the lowest basal surface dislocation density and Substrate 23 had next lower density, and Substrate 22 had the highest density. When the measurement results of the peak shift illustrated in FIGS. 11 to 13 were linearly approximated temporarily and the inclinations of the straight line [average peak shift amount (sec/mm)] were compared, Substrate 23 had the largest inclination among the three substrates, and also had a relatively large difference between the maximum value and the minimum value of the second polynomial equation. However, Substrate 22 is decisively different from Substrate 23 in that there is no undulation in the peak shift, and such a difference clearly appears in the basal surface dislocation density.

Therefore, using these substrates 21, 22 and 23 as seed crystals, a SiC single crystal ingot was produced by a sublimation recrystallization method. The manufacturing conditions were common and a substrate to be a seed crystal was attached to the inner surface of a graphite-made crucible lid forming a crucible so that the C surface was to be the crystal growth surface, and the SiC raw material powder was filled in a graphite-made crucible. The crucible lid and the crucible main body were covered with a heat insulating material and placed on the graphite supporting platform inside the double quartz tube. For crystal growth, the interior of the double quartz tube was evacuated and then an electrical current was applied through a work coil placed around the double quartz tube while flowing high-purity Ar gas and maintaining the pressure inside the double quartz tube at a predetermined pressure to heat lower part of the crucible body to the target temperature of 2,400° C. and the upper part of the crucible lid to the target temperature of 2,000° C., and the pressure in the double quartz tube 7 was brought to the growing pressure, i.e., 1.33 kPa, and the crystal was grown for 80 hours. In these substrates 21 to 23, the surface roughening had occurred on the C surface and the pits had appeared on the Si surface due to the previous KOH etching. However, it is possible to use such a substrate as a seed crystal for the crystal growth by the sublimation recrystallization method.

Substrates having a diameter of 150 mm were prepared from the three SiC single crystal ingots produced as described above under the same processing conditions as those for Substrates 21, 22 and 23, wherein Substrate 31 was a substrate obtained from SiC single crystal ingot using Substrate 21 as a seed crystal, Substrate 32 was obtained from a SiC single crystal ingot using Substrate 22 as a seed crystal, and Substrate 33 was obtained from a SiC single crystal ingot using Substrate 23 as a seed crystal.

Figure 17:
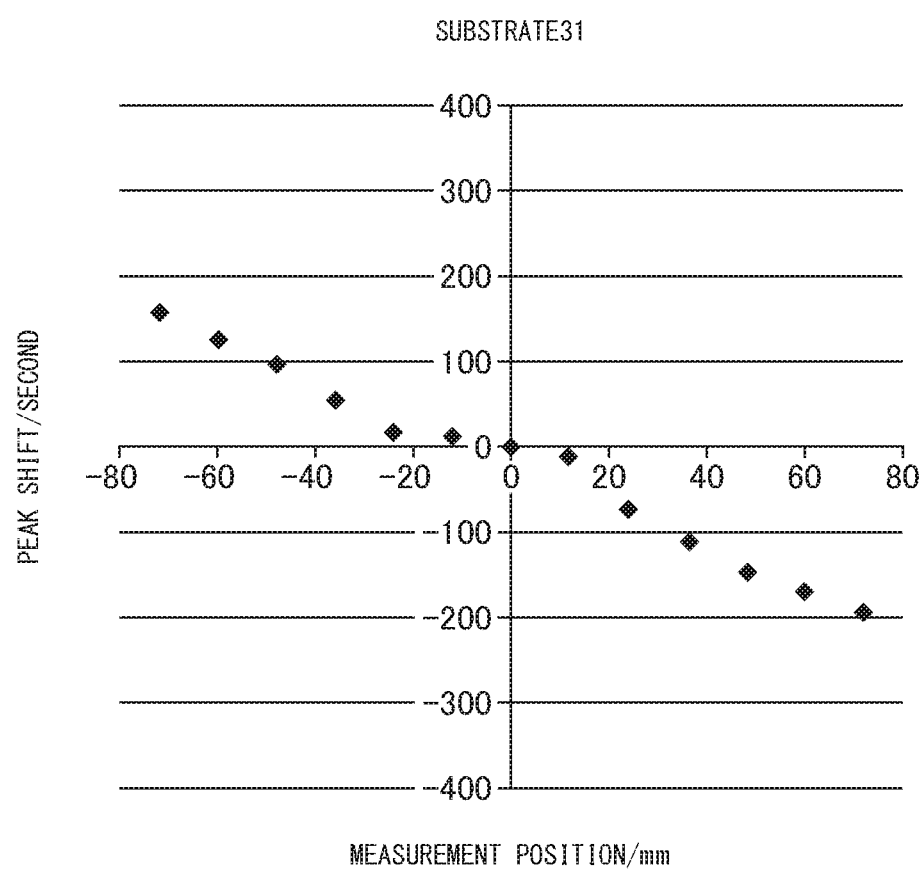
FIG. 17 is a graph illustrating the result of peak shift measurement of the substrate 31 in Examples.
Figure 18:
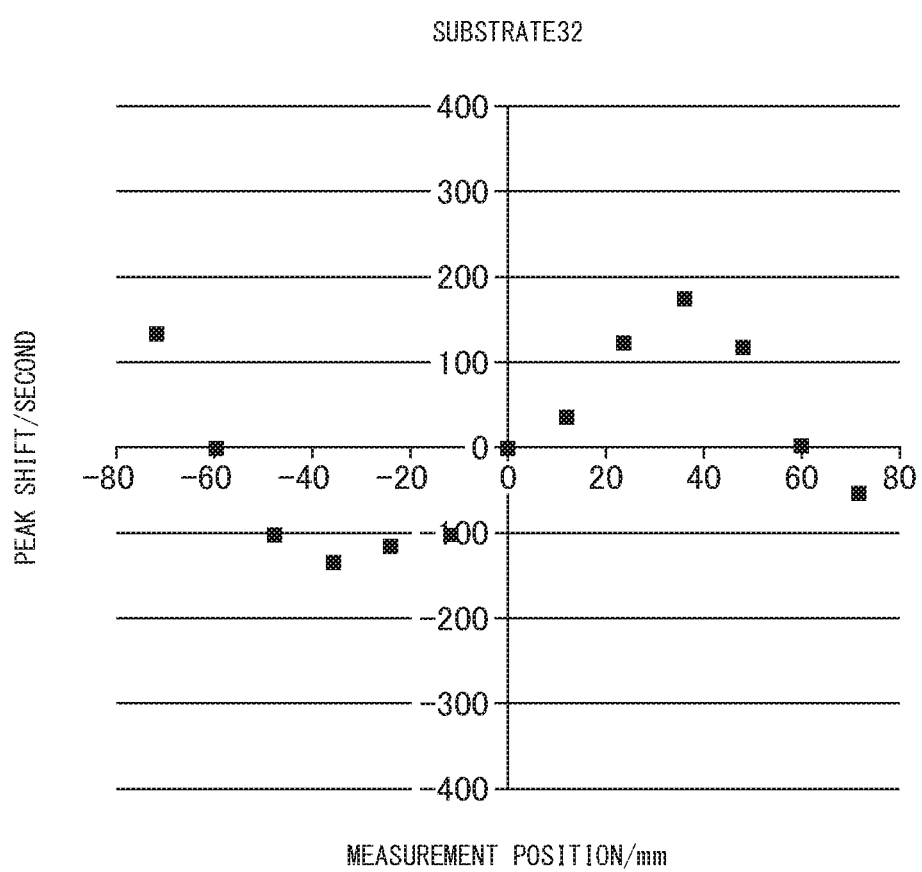
FIG. 18 is a graph illustrating the result of peak shift measurement of the substrate 32 in Examples.
Figure 19:
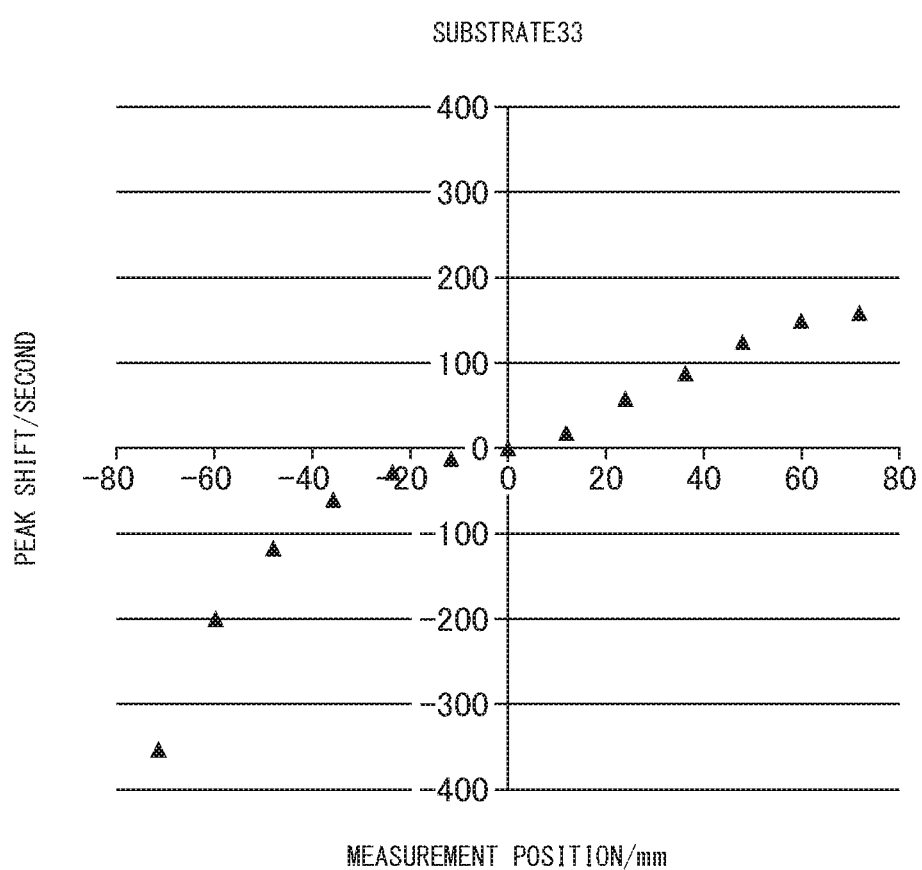
FIG. 19 is a graph illustrating the result of peak shift measurement of the substrate 33 in Examples.
Figure 20:
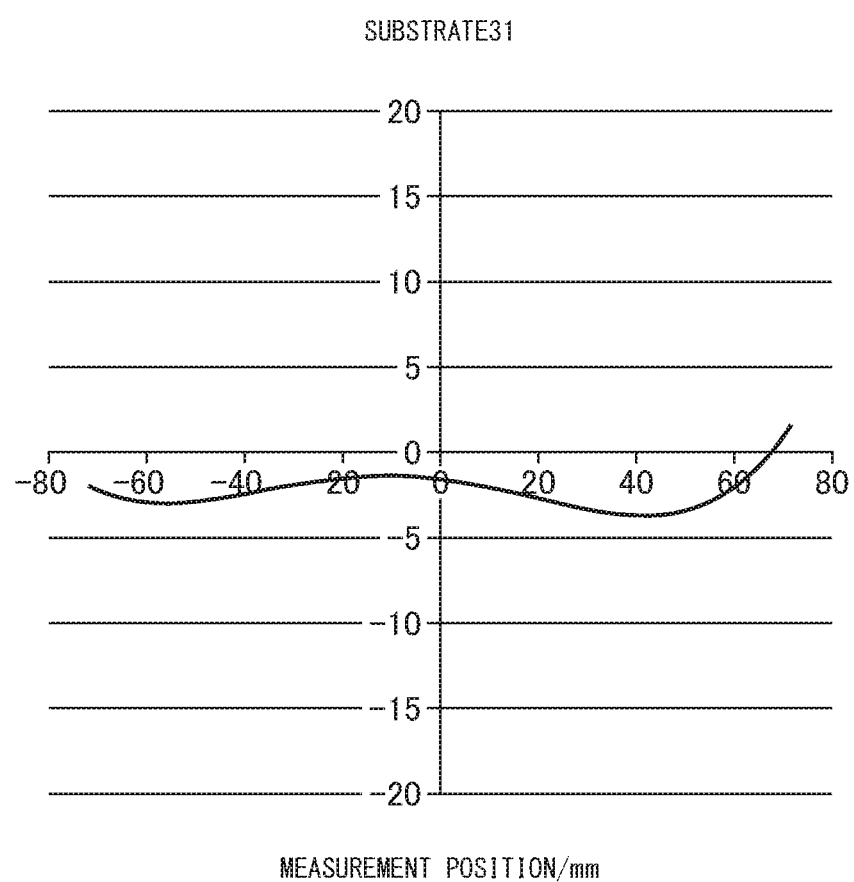
FIG. 20 is a graph illustrating a second polynomial equation obtained by differentiating the first polynomial equation of the substrate 31 illustrated in FIG. 17.

With respect to these substrates 31, 32, and 33, peak shift values were calculated in the same manner as in the case of the substrates 21, 22, and 23 to obtain first polynomial equations each of which was a fifth order approximation equation. The results of peak shift measurement are illustrated in FIG. 17 (Substrate 31), FIG. 18 (Substrate 32), and FIG. 19 (Substrate 33). In addition, the first polynomial equation was differentiated to obtain a second polynomial equation composed of a fourth order polynomial equation. The results are illustrated in FIG. 20 (Substrate 31), FIG. 21 (Substrate 32), and FIG. 22 (Substrate 33). The determination coefficient $R^2$ when approximating the first polynomial equation relating to the substrate 31 is 0.99, the determination coefficient $R^2$ when approximating the first polynomial equation on the substrate 32 is 0.97, and determination coefficient $R^2$ when approximating the first polynomial equation relating to the substrate 33 is 0.99.

Figure 21:
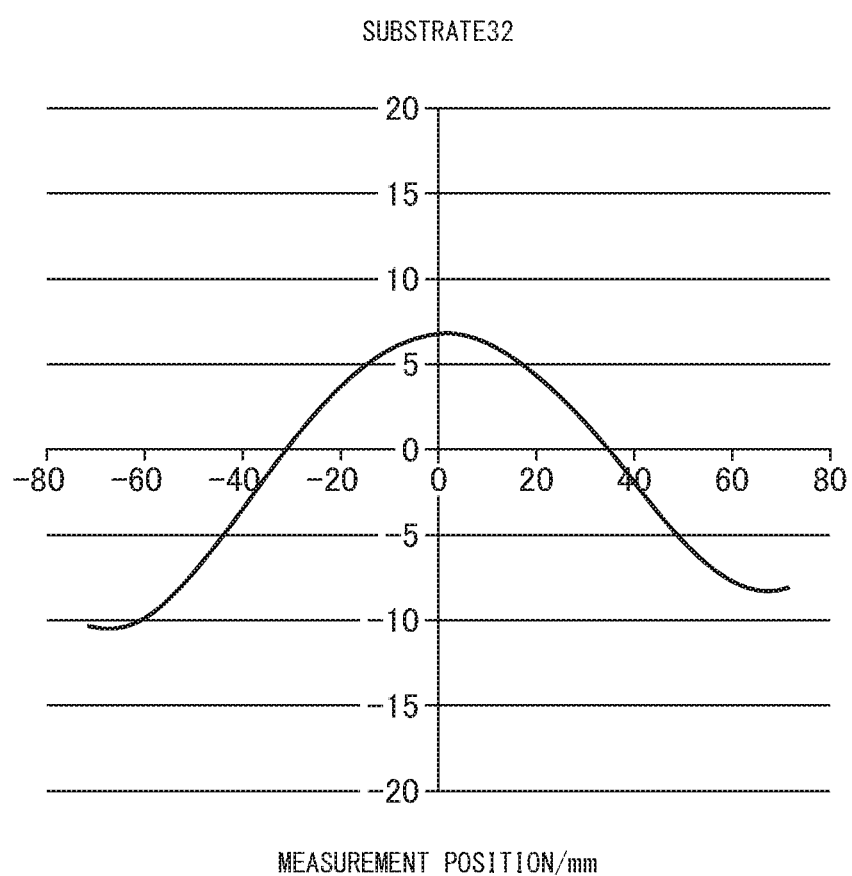
FIG. 21 is a graph illustrating a second polynomial equation obtained by differentiating the first polynomial equation of the substrate 32 illustrated in FIG. 18.
Figure 22:
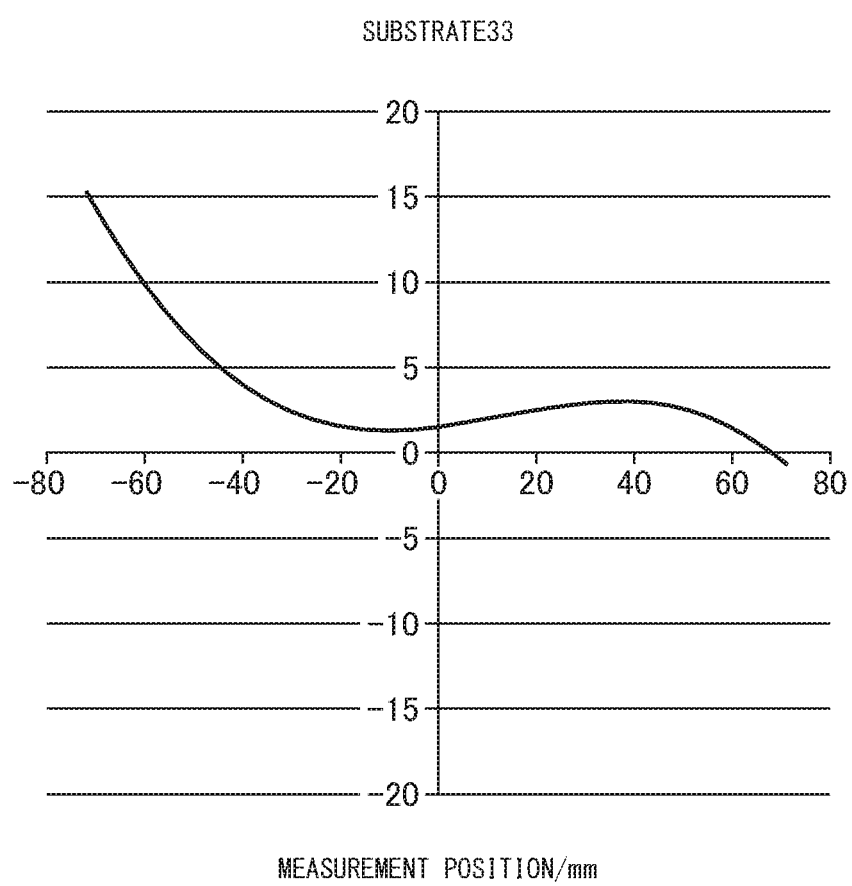
FIG. 22 is a graph illustrating a second polynomial equation obtained by differentiating the first polynomial equation of the substrate 33 illustrated in FIG. 19.

For the graphs of the second polynomial equation of FIG. 20 (Substrate 31), FIG. 21 (Substrate 32) and FIG. 22 (Substrate 33) obtained above, it was confirmed whether or not these graphs pass through Y=0 (intersect with Y=0), and the difference between the maximum value and the minimum value of the inclination (Y) was obtained. The results are illustrated in Table 5.

TABLE 5

| | EVALUATION OF THE SECOND POLYNOMIAL EQUATION | | |
|---|---|---|---|
| | NUMBER OF PASSING ACROSS Y = 0 | MAXIMU-MINIMUM | EVALUATION RANK |
| SUBSTRATE 31 | 1 | 5.30 | 1 |
| SUBSTRATE 32 | 2 | 17.10 | 3 |
| SUBSTRATE 33 | 1 | 16.09 | 2 |

As illustrated in Table 5, the second polynomial equation of the substrate 31 passes through Y=0 once. It is because a maximum value appeared at this position, since, as is apparent from the result of the peak shift measurement illustrated in FIG. 17, actually, there is no undulation of the peak shift value such that the function has an extreme value. The same applies to substrate 33. Therefore, it is possible to comprehensively judge the graphs of the first polynomial equation and the second polynomial equation, and the single pass across Y=0 of the substrate 31 and the substrate 33 can be neglected at the time of quality evaluation. On the other hand, the second polynomial equation of the substrate 32 passes through Y=0 twice, and it is considered that the quality of Substrate 22 used as a seed crystal was taken over as it was. The substrate 31 exhibits the lowest value as to the difference between the maximum value and the minimum value of the inclination (Y) of the second polynomial equation.

Therefore, among the three seed crystals of the substrates 21 to 23 initially prepared in Example 2, by using Substrate 21 as a seed crystal, it was possible to manufacture a high-quality SiC single crystal ingot with the least dislocation. By using Substrate 23, it can be said that SiC single crystal ingot having the quality next to Substrate 21 could be manufactured.

In order to confirm this point, the basal surface dislocation density was determined by KOH etching for the three substrates (SiC single crystal substrate) of the substrates 31 to 33 cut out from each SiC single crystal ingot in the same manner as in Example 1. The results are illustrated in Table 6, and the basal surface dislocation density of the substrate 31 is very smaller than that of the substrate 32, and the substrate 33 was a substrate having a low dislocation density next to the substrate 31.

TABLE 6

| | EVALUATION BY KOH ETCHING | |
|---|---|---|
| | BASAL SURFACE TRANSFRENCE DENSITY (transferences/cm$^2$) | EVALUATION RANK |
| SUBSTRATE 31 | 453 | 1 |
| SUBSTRATE 32 | 15950 | 3 |
| SUBSTRATE 33 | 2420 | 2 |

Comparative Example 1

The results of the peak shift measurement obtained in Example 1 above were linearly approximated as in the conventional method described in PTL2 and the like instead of being approximated by a fifth order polynomial equation. Then, the inclination of thus obtained straight line [that is, the average peak shift amount (sec/mm)] and the difference between the maximum value and the minimum value of the peak shift value (measured data) were obtained to evaluate the substrates 11, 12, and 13. The results are illustrated in Table 7.

TABLE 7

| | CONVENTIONAL METHOD FOR PEAK SHIFT ANALYSIS | | |
|---|---|---|---|
| | INCLINATION OF LINEAR APPROXIMATION LINE | MAXIMU-MINIMUM | EVALUATION RANK |
| SUBSTRATE 11 | −3.32 | 348.84 | 2 |
| SUBSTRATE 12 | 0.35 | 163.44 | 1 |
| SUBSTRATE 13 | 3.86 | 389.16 | 3 |

As illustrated in Table 7, according to the conventional peak shift method for evaluating, Substrate 12 has the highest quality, the second is Substrate 11, and the last is Substrate 13. However, it does not coincide with the evaluation result of the basal surface dislocation density by the KOH etching illustrated in Table 2 in Example 1. In other words, it can be understood that the amount of dislocation cannot be evaluated in the conventional method for evaluating peak shift, although the shape of the basal surface of the SiC single crystal can be captured.

As described above, according to the present invention, it is possible to evaluate the quality of SiC single crystal by a non-destructive and simple method. Further, by using the present invention, seed crystals used in the sublimation recrystallization method can be screened, and a high-quality SiC single crystal ingot with less dislocation can be manufactured with high reproducibility.

REFERENCE SIGNS LIST

1. SiC single crystal body
1a. Basal surface
2. X-ray irradiator
3. X-ray detector

The invention claimed is:

1. A method for evaluating the quality of a SiC single crystal body composed of a disc-shaped silicon carbide single crystal,
which comprises
conducting an X-ray rocking curve measurement of a main surface of the SiC single crystal body on a predetermined diffraction surface;
obtaining an angle $\Omega$ at a plurality of measurement points $P_n$ on a diameter of the main surface, wherein the $\Omega$ is an angle between an X-ray incident direction and the main surface when a diffraction peak is exhibited; and
calculating the difference ($\Omega_n - \Omega_0$) as a respective peak shift value, in which $\Omega_0$ is an angle at a certain reference measurement point $P_0$ and $\Omega_n$ is an angle at a measurement point $P_n$ other than $P_0$ among these measurement points;
obtaining a relation between the location of the measurement point $P_n(X)$ on the diameter of the main surface and the peak shift value (Y) as a first polynomial equation;
linearly differentiating the first polynomial equation to obtain a second polynomial equation, and evaluating the quality of the SiC single crystal body based on these polynomial equations.

2. The method for evaluating the quality of a SiC single crystal body according to claim 1, wherein, when the second polynomial equation is expressed as a graph in which the Y axis indicates the inclination of the first polynomial equation and the X axis indicates the position of the measurement point $P_n$ on the diameter of the main surface of the SiC single crystal body, the quality is evaluated by determining whether the graph of the second polynomial equation passes Y=0 or not.

3. The method for evaluating the quality of a SiC single crystal body according to claim 2, wherein the quality is evaluated by determining whether a graph representing the second polynomial equation passes Y=0 twice or not.

4. The method for evaluating the quality of a SiC single crystal body according to claim 2, wherein the quality is evaluated by determining whether a function of a peak shift value (Y) in the first polynomial equation has a local maximum value or a local minimum value.

5. The method for evaluating the quality of a SiC single crystal body according to claim 1, wherein, when the second polynomial equation is expressed as a graph in which the Y axis indicates the inclination of the first polynomial equation and the X axis indicates the position of the measurement point on the diameter of the main surface of the SiC single crystal body, the quality is evaluated by a difference between a maximum value and a minimum value of the inclination (Y).

6. The method for evaluating the quality of a SiC single crystal body according to claim 1, wherein the degree of the first polynomial equation is 4 or more.

7. The method for evaluating the quality of a SiC single crystal body according to claim 1, wherein the reference measurement point $P_0$ is a center point of the main surface of the SiC single crystal body.

8. The method for evaluating the quality of a SiC single crystal body according to claim 1, which comprises determining a basal surface dislocation density of the SiC single crystal body.

9. A method for producing a silicon carbide single crystal ingot which comprises growing a silicon carbide single crystal on a seed crystal by a sublimation recrystallization method,
wherein
an X-ray rocking curve measurement of a main surface of a SiC single crystal body composed of a disc-shaped silicon carbide single crystal is previously conducted on a predetermined diffraction surface;
an angle $\Omega$ is obtained at a plurality of measurement points $P_n$ on a diameter of the main surface, wherein the $\Omega$ is an angle formed between an X-ray incident direction and the main surface when a diffraction peak is exhibited;
the difference $\Omega_n - \Omega_0$ is calculated as a respective peak shift value, in which $\Omega_0$ is an angle at a certain reference measurement point $P_0$ and $\Omega_n$ is an angle at a measurement point $P_n$ other than $P_0$ among these measurement points;
a relationship between the position of the measurement point $P_n(X)$ on the diameter of the main surface and the peak shift value (Y) is obtained as a first polynomial equation;
the first polynomial equation is linearly differentiated to obtain a second polynomial equation, and when thus obtained second polynomial equation is expressed as a graph in which the Y axis indicates the inclination of the first polynomial equation and the X axis indicates the position of the measurement point $P_n$ on the diameter of the main surface of the SiC single crystal body, the SiC single crystal body whose graph does not pass Y=0 twice or more is used as the seed crystal.

* * * * *